United States Patent
Appelt et al.

[11] Patent Number: 6,114,098
[45] Date of Patent: Sep. 5, 2000

[54] METHOD OF FILLING AN APERTURE IN A SUBSTRATE

[75] Inventors: Bernd Karl Appelt, Endicott; John Steven Kresge, Binghamton; John Matthew Lauffer, Waverly; Kostas I. Papathomas, Endicott, all of N.Y.

[73] Assignee: International Business Machines Corporation, Armonk, N.Y.

[21] Appl. No.: 09/154,935

[22] Filed: Sep. 17, 1998

[51] Int. Cl.[7] ........................................ G03F 7/00
[52] U.S. Cl. ............................ 430/315; 427/96; 427/97; 428/345
[58] Field of Search .............................. 430/315; 427/96, 427/97; 428/345

[56] References Cited

U.S. PATENT DOCUMENTS

| | | | |
|---|---|---|---|
| 4,032,743 | 6/1977 | Erbach et al. | 219/121 |
| 4,434,134 | 2/1984 | Darrow | 419/5 |
| 4,881,320 | 11/1989 | Kohle et al. | 29/841 |
| 5,277,928 | 1/1994 | Seki et al. | 427/97 |
| 5,367,143 | 11/1994 | White, Jr. | 219/121.68 |
| 5,435,480 | 7/1995 | Hart et al. | 228/180 |
| 5,536,677 | 7/1996 | Hubacher | 437/183 |
| 5,556,807 | 9/1996 | Bhattacharyya | 437/209 |
| 5,669,970 | 9/1997 | Balog et al. | 118/213 |
| 5,673,846 | 10/1997 | Gruber | 228/180.22 |
| 5,678,287 | 10/1997 | Smith et al. | 29/840 |
| 5,822,856 | 10/1998 | Bhatt | 29/832 |
| 5,840,465 | 11/1998 | Kakinuma | 430/270.1 |

*Primary Examiner*—Janet Baxter
*Assistant Examiner*—Nicole Barreca
*Attorney, Agent, or Firm*—John R. Pivnichny

[57] ABSTRACT

An aperture in an electronic substrate is filled with a filling material without need for a specially built fill mask. A layer of tape or tentable photosensitive dielectric film is applied to one surface of the substrate covering the aperture. An opening is made in the tape or film by directing radiation through the aperture. Fill material is then forced through the opening to substantially fill the aperture. Protruding nubs may be removed to planarize the substrate surfaces.

13 Claims, 6 Drawing Sheets

METHOD OF FILLING AN APERTURE IN A SUBSTRATE

TECHNICAL FIELD

The invention relates to a method of filling an aperture in a substrate and particularly to filling an aperture in an electronic substrate which may be personalized or subsequently personalized to support and interconnect chips or other electronic components. Even more particularly the invention relates to an aperture which has conductive plating on its walls to form a plated through hole connection between conductive layers in a substrate.

BACKGROUND OF THE INVENTION

Electronic substrates of both organic and ceramic construction typically have a plurality of conductive layers separated by the insulating material. Electrical connection is made between layers by means of plated through holes which in the case of organic insulators are usually plated along with plating a layer of conductive metal—e.g. copper on the top and bottom substrate surfaces. This plating is done prior to patterning or personalizing the surface conductive layers to form the interconnection geometry such as circuit lines, lands, and component or wire mounting pads. Other holes and openings may also be made in the substrate to accommodate mounting hardware or provide clearance for component parts to pass through the substrate. These other holes may be plated or unplated depending on the application.

Drilling and punching are two ways of forming the holes and apertures (hereinafter also referred to as holes) which are widely practiced in the electronic substrate industry, with drilling predominant in the manufacture of epoxy-glass substrates.

In the past, a large proportion of the plated through holes in a substrate provided both the interconnection function described above as well as accommodated a component lead of a pin-through-hole component. The component lead was then securely bonded mechanically and electrically to the plated walls of the hole by a soldering process such as wave solder or vapor phase soldering. However, with the shift to surface mount components, most plated through holes now perform only the interconnect function with no need to accommodate a component lead. Consequently, designers and manufacturers of electronic substrate have reduced the diameter of the holes as much as possible until a minimum drill diameter is reached below which drill breakage became excessive or below which plating fluids will not reliably enter the hole. Various advances in drill materials, drill designs, and drill processing are directed toward allowing smaller holes to be drilled and therefore reduce the proportion of valuable circuit real estate of a substrate that is needed for the through holes. However, drilled holes are currently still much larger than necessary merely to provide an electrical connection between layers.

It is also desirable to fill the holes after plating and planarize the surface so that additional layers of conductors and insulators can be positioned over the holes and patterned thus permitting a high wiring density on additional conductor layers by running circuit lines either partially or directly over the holes. Consequently, various techniques have been developed to permit such hole filling. With all hole filling techniques it is necessary to prevent the hole filling material from contacting the top and bottom surface of the substrate or to remove it prior to curing. Otherwise, the presence of hole filling material interferes with subsequent processing such as etching, plating, adhesion or lamination of the substrate surface. Thus, the filling of through holes in a printed circuit board is usually carried out by silk screen printing.

In U.S. Pat. No. 5,669,970 Balog et al. place a stencil having holes in a pattern corresponding to the holes in a substrate, in contact with the substrate. Solder paste material is then spread over the stencil where it passes through the holes in the stencil and into the holes in the substrate without contacting the surface of the substrate. The upper surface of the stencil has relieved portions to increase friction between upper surface and the solder paste thereby permitting increased speed of spreading with a squeegee blade.

Seki et al. in U.S. Pat. No. 5,277,929 adds an additional masking seal over some holes to prevent filler material from entering specific holes.

Gruber in U.S. Pat. No. 5,673,846 places a decal strip with holes aligned to holes in a mold over the mold. Liquid solder is then injected through the holes in the decal to fill the holes in the mold.

Hart et al. in U.S. Pat. No. 5,435,480 uses a stainless steel template on the top surface of a printed circuit card to control the flow of solder balls through a hole in the template and into a hole in the circuit card. An adhesive film such as polyimide is placed on the bottom side of the substrate to prevent the solder balls from falling out the bottom side of the substrate prior to reflow.

Masking techniques as described above require fabrication of a mask having holes arranged to correspond to the holes in a substrate which are desired to be filled. Accurate fabrication of such a mask is an expensive procedure. Furthermore the mask must also be accurately aligned to the substrate and held into contact with the substrate to prevent fill material from leaking between the mask and the substrate. Usually the mask must be removed from the substrate by peeling after the fill material has been applied and before cure of the fill material. The mask may be re-used, if not damaged during removal, and sometimes after cleaning of excess fill material, on another substrate having an identical hole pattern. Additional masks are needed for other hole patterns requiring an extensive library of masks to accommodate the various hole patterns encountered in substrate manufacture.

In accordance with the present invention there is provided a method of hole filling which eliminates the need to accurately fabricate, align, and maintain a library of hole filling masks.

It is believed this method represents a significant advancement in the art of substrate manufacture.

OBJECTS AND SUMMARY OF THE INVENTION

It is therefore a principal object to the present invention to enhance the substrate manufacturing art by providing an enhanced method of filling an aperture with fill material.

It is a further object to provide a method of hole filling in a substrate applicable to both plated and unplated holes without requiring construction of an expensive fill mask.

These and other objects are attained in accordance with one embodiment of the invention wherein there is provided a method of substantially filling an aperture in a substrate with a quantity of fill material which comprises the steps of providing a substrate having first and second opposing surfaces and an aperture passing through the substrate from the first opposing surface to the second opposing surface, positioning a layer of a first tape adjacent the first surface of the substrate to cover the aperture, directing radiant energy through the aperture and onto the layer of a first tape to form an opening in the layer of a first tape adjacent the aperture, and forcing a quantity of fill material through the opening in the layer of a first tape and into the aperture to substantially fill the aperture.

In accordance with another embodiment of the invention there is provided a method of substantially filling an aperture in a substrate with a quantity of fill material which comprises the steps of providing a substrate having first and second opposing surfaces and an aperture passing through the substrate from the first opposing surface to the second opposing surface, positioning a layer of photosensitive dielectric material adjacent the first opposing surface of the substrate to cover the aperture, directing radiant energy through the aperture and onto the layer of photosensitive dielectric material to expose the layer of photosensitive dielectric material adjacent the aperture, developing the photosensitive dielectric material to form an opening therein adjacent the aperture, and forcing a quantity of fill material through the opening in the photosensitive dielectric material and into the aperture to substantially fill the aperture.

BEST MODE FOR CARRYING OUT THE INVENTION

For a better understanding of the present invention, together with other and further objects, advantages, and capabilities thereof, reference is made to the following disclosure and the appended claims in connection with the above described drawings.

Figure 1:
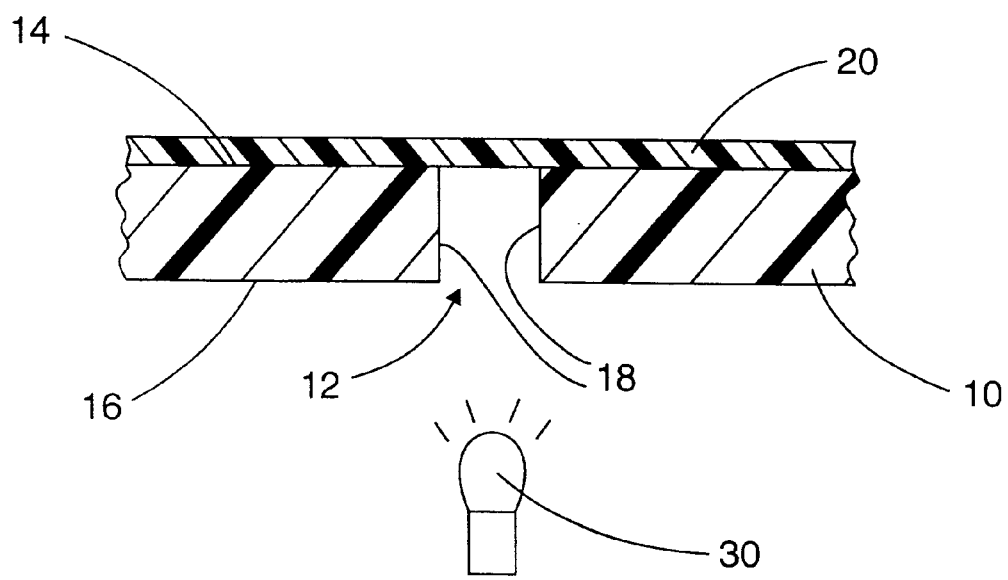
FIG. 1 illustrates in cross section a substrate with an aperture covered with a layer of tape and a source of radiation energy below the substrate in accordance with the present invention.

In FIG. 1 there is shown a substrate 10 in accordance with one embodiment of the invention. Substrate 10 includes at least one (and preferably several) aperture 12 therein passing through from substantially planar first surface 14 to second surface 16. As indicated, substrate 10 is of an organic material, a preferred example being an epoxy-glass material well known in the printed-circuit board art. Other materials are acceptable including various polyimides including KAPTON™ (KAPTON is a trademark of E.I. DuPont de Nemours & Co.) and TEFLON™ (TEFLON is a trademark of E.I. DuPont de Nemours & Co.). Substrate 10 may also be of ceramic material such as alumina. Substrate 10 may also include internally, or as a surface, one or more electrically conductive planes (not shown) of copper, aluminum, molybdenum, silver alloy, gold plating or other materials known in the substrate manufacturing arts. The electrically conductive plane may also be patterned into circuit lines, lands, or pads.

Aperture 12 in substrate 10 may be any type of opening passing through from top to bottom, including a drilled hole, punched or cut-out opening or irregularly shaped opening. Walls 18 of aperture 12 may include a layer of conductive metal such as may be provided by electrolytic or electroless plating, for example to provide an electrical connection between the electrically conductive planes.

A layer of tape 20 is positioned adjacent first surface 14 of substrate 10 thereby covering aperture 12. Tape 20 is preferably type NT-7411-5 Fume Mask having a 1 mil polyester backing and a 0.5 mil crosslinked silicon adhesive layer available from Dielectric Polymers, Incorporated of Holyoke, Mass. Other tapes with or without an adhesive layer may be used provided they are compatible with a hole filling material to be described and are capable of covering aperture 12. For example tape 20 may be a KAPTON tape with an acrylic adhesive, a silicon adhesive, a water soluble adhesive or other easily removed, non-permanent adhesive or a tack type adhesive. Alternatively, tape 20 may be a tentable photosensitive dielectric material preferably in a dry film form. One suitable photosensitive material is manufactured by Morton Electronic Material Co. of Tustin, Calif. and sold under the trademark ADVANCED SUBSTRATE MATERIAL™ as trade name LB404.

Figure 2:
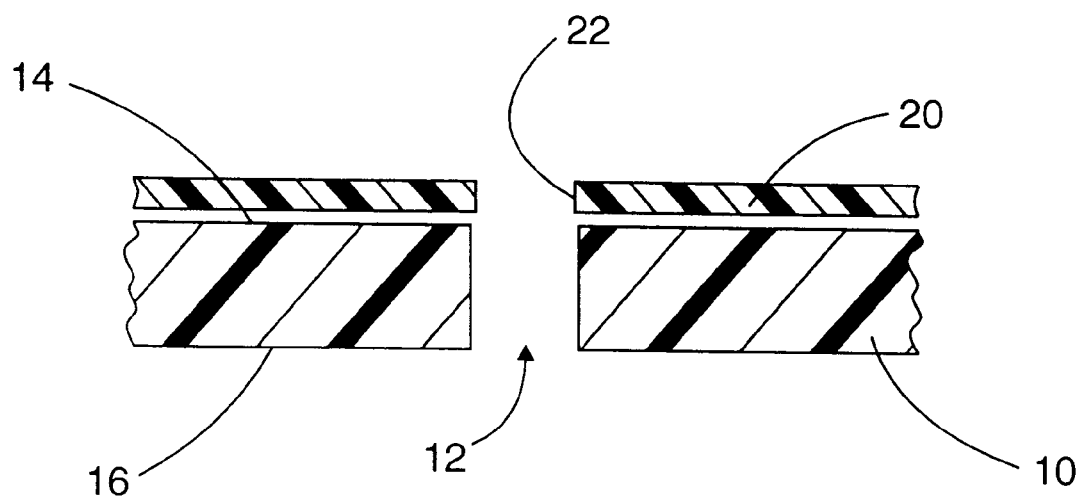
FIG. 2 shows an opening in the layer of tape over the substrate aperture.

Source 30 of electromagnetic radiation is preferably an RF-excited $CO_2$ laser which emits radiation at a wavelength of about 10.6 µm. An ultraviolet laser source is also acceptable. Source 30 is positioned beyond second surface 16, which is preferably copper, of substrate 10. Radiation at this wavelength is reflected by the copper but passes through aperture 12, striking tape 20 where it is absorbed, forming an opening 22 in the tape as shown in FIG. 2. Opening 22 need not be of the same size as aperture 12, provided it is sufficiently large to permit fill material to pass through and into aperture 12.

In another embodiment of the present invention, source 30 may be a source of exposure radiation matched to a tentable, positive acting, photosensitive dielectric film tape. Upon striking second surface 16 of substrate 10, such radiation has no effect, however, by passing through aperture 12, such radiation strikes photosensitive dielectric film 20 causing it to be exposed in the region above aperture 12. Subsequent processing of dielectric 20 with a developer causes an opening 22 to be formed in the dielectric above aperture 12. The opening may also be formed by directly ablating the photosensitive dielectric film with the radiation in which case it does not need to be positive acting.

Figure 3:
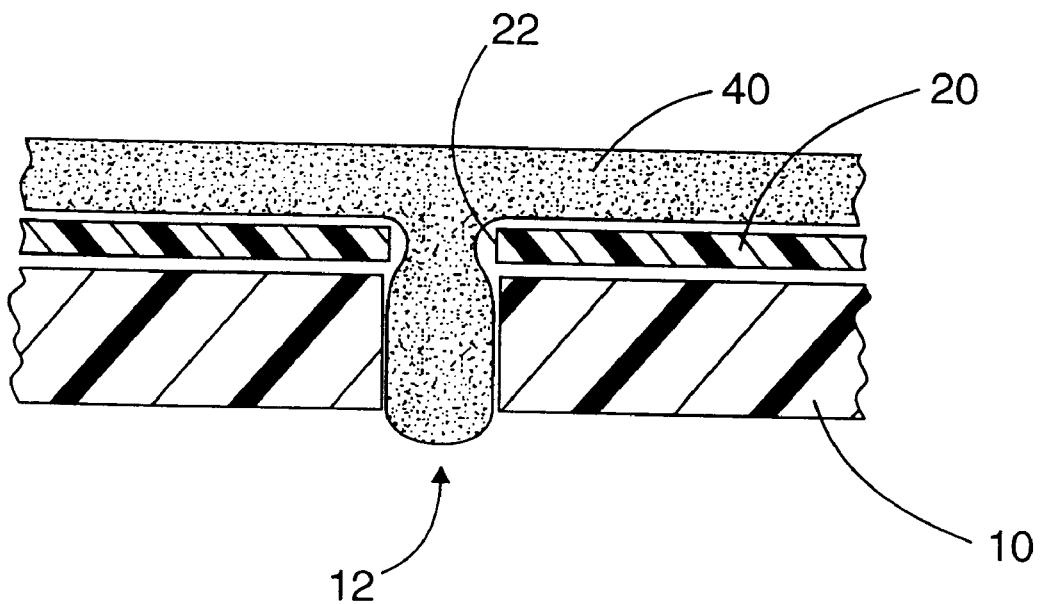
FIG. 3 illustrates filling the aperture by forcing fill material through the opening in the layer of tape.
Figure 4:
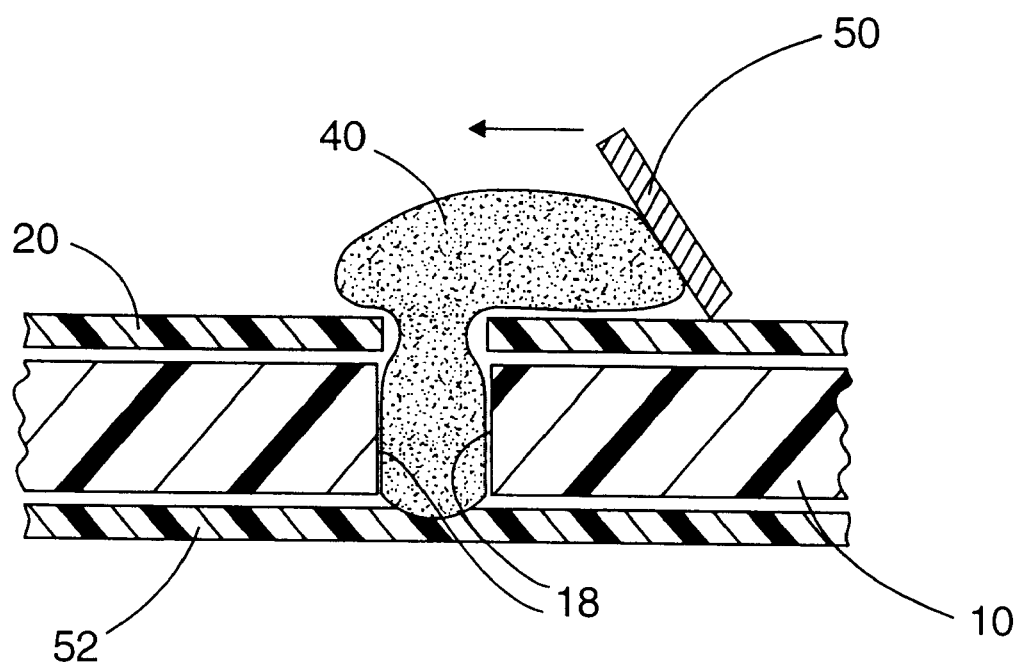
FIG. 4 shows another method of filling the aperture by spreading fill material over the layer of tape with a squeegee.
Figure 5:
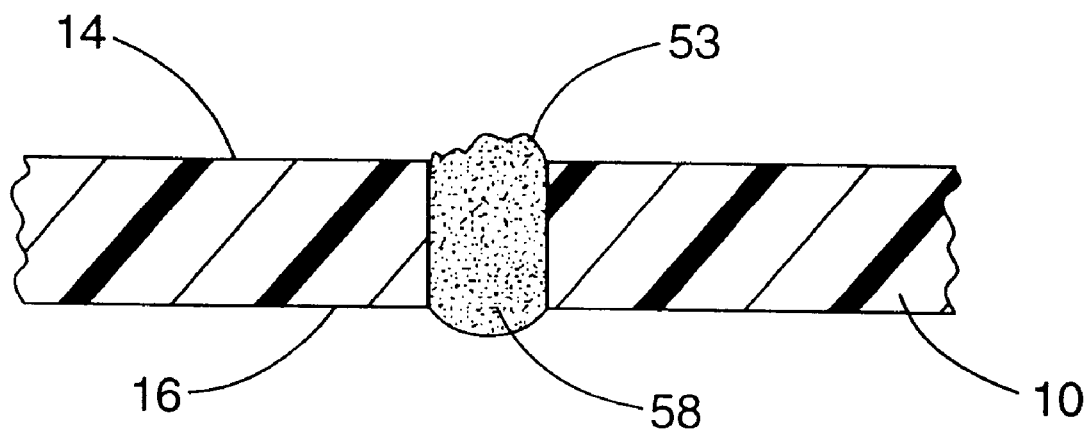
FIG. 5 shows in cross section the aperture filled with filling material after the layer of tape is removed.
Figure 6:
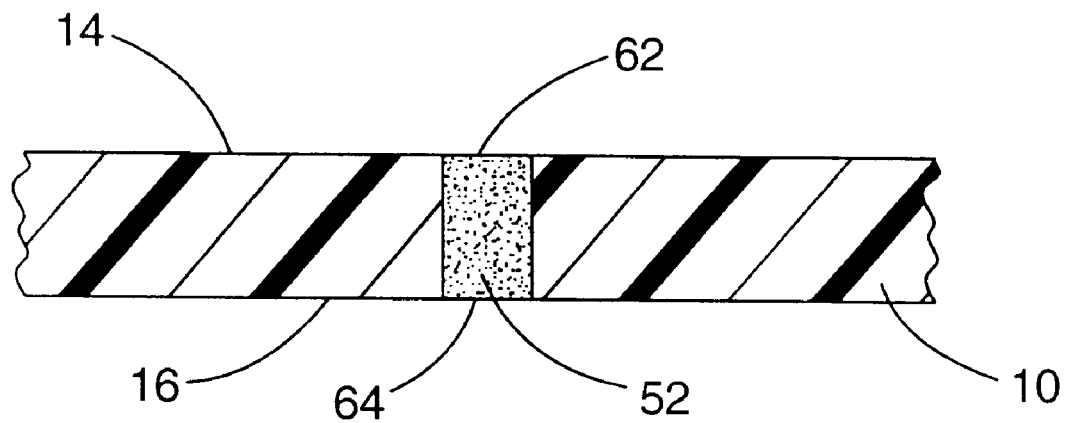
FIG. 6 shows excess fill material removed to planarize the substrate surface.

In FIG. 3, aperture 12 is filled with a fill material 40. In a preferred embodiment, material 40 is an epoxy resin including particulate matter such as copper dust, silver flakes, or silicon dioxide particulates which reduce the effective coefficient of thermal expansion of the hole fill material to more closely match the expansion coefficient of the substrate 10. Other hole fill materials may be used such as various solder pastes and electrically conductive adhesives. Materials which can sinter and thus become electrically conductive may also be used. Fill material 40 may be forced through opening 22 into aperture 12 by lamination as shown in FIG. 3, preferably with vacuum assist (not shown). Alternatively fill material 40 may be spread over tape 20 with a squeegee 50 and thereby forced through opening 22 into aperture 12, and into intimate contact with walls 18 of aperture 12 as shown in FIGS. 4–6. After an opening is formed in tape 20, a bottom cover 52 may optionally be positioned adjacent the bottom surface 16 of substrate 10 thereby covering the bottom of aperture 12 as shown in FIG. 4. Bottom cover 52 may be of the same material as tape 20 or any other suitable material including metals such as copper, brass, aluminum, stainless steel, or non-metals such as KAPTON or other polyimide materials. When used, bottom cover 52 serves to prevent or reduce the flow of fill material 40 out the bottom of aperture 12 as shown in FIG. 4.

After filling, whether by lamination or another process, tape 20 is removed, preferably by peeling away from substrate 10 to remove any left over fill material. A tentable photosensitive dielectric film may also be removed by chemical stripping. Bottom cover 52, if used may also be removed or left in place depending on the product construction requirements. Fill material 40 is cured by heat, radiation or any other cure method. It may also be partially or fully cured before removing tape 20.

In FIG. 5 there is shown a rough surface 53 on the plug 58 of fill material 40 which remains after removal of tape 20. Such rough surfaces which extend above the top surface 14 of substrate 10 are known as nubs. Another nub may also be present below the bottom surface 16 of substrate 10. The nubs are undesirable for most applications and in those cases are removed by abrasion, scraping or other means to make plug 58 have top 62 and bottom 64 surfaces which are substantially level with top 14 and bottom surfaces 16 respectively of substrate 10 as shown in FIG. 6. The invention is thus deemed to constitute a significant advancement in the art.

While there have been shown and described what are at present the preferred embodiments of the invention, it will be obvious to those skilled in the art that various changes and modifications can be made therein without departing from the scope of the invention as defined by the appended claims.

What is claimed is:

1. A method of substantially filling an aperture in a substrate with a quantity of fill material, comprising the steps of:

providing a substrate having first and second opposing surfaces and an aperture passing through said substrate from said first opposing surface to said second opposing surface;

positioning a layer of a first tape adjacent to said first surface of said substrate to cover said aperture;

directing radiant energy through said aperture and onto said layer of a first tape to form an opening in said layer of a first tape adjacent said aperture; and forcing a quantity of fill material first through said opening in said layer of a first tape and then into said aperture to substantially fill said aperture.

2. The method of claim 1 wherein radiant energy at a wavelength of about 10.6 µm from an RF-excited CO2 laser is directed through said aperture and onto said layer of a first tape to form an opening in said layer of a first tape adjacent said aperture.

3. The method of claim 1 wherein said quantity of fill material is forced through said opening by spreading said quantity of fill material over said layer of a first tape with a squeegee.

4. The method of claim 1 wherein said quantity of fill material is forced through said opening by positioning a layer of said fill material adjacent said layer of a first tape and applying pressure to said layer of fill material.

5. The method of claim 4 further comprising applying heat to said layer of fill material while applying said pressure to said layer of fill material.

6. The method of claim 1 further comprising removing said layer of a first tape after said forcing said quantity of fill material through said opening in said layer of a first tape.

7. The method of claim 1 further comprising curing said quantity of fill material after said quantity of fill material is forced into said aperture.

8. The method of claim 1 further comprising the step of positioning a layer of a second tape adjacent to said second opposing surface of said substrate prior to forcing said quantity of fill material through said opening in said layer of a first tape.

9. The method of claim 1 wherein a quantity of fill material comprising an epoxy resin and a particulate of copper dust, silver flakes, or silicon dioxide is forced through said opening in said layer of a first tape and into said aperture to substantially fill said aperture.

10. The method of claim 1 further comprising removing any excess fill material which protrudes above said first or second opposing surfaces of said substrate, by abrasion.

11. A method of substantially filling an aperture in a substrate with a quantity of fill material, comprising the steps of:

providing a substrate having first and second opposing surfaces and an aperture passing through said substrate from said first opposing surface to said second opposing surface;

positioning a layer of photosensitive dielectric material adjacent to said first opposing surface of said substrate to cover said aperture;

directing radiant energy through said aperture and onto said layer of photosensitive dielectric material to expose said layer of photosensitive dielectric material adjacent said aperture;

developing said photosensitive dielectric material to form an opening therein adjacent said aperture; and forcing a quantity of fill material first through said opening in said photosensitive dielectric material and then into said aperture to substantially fill said aperture.

12. The method of claim 11 further comprising removing by stripping said layer of photosensitive dielectric material after said forcing said quantity of fill material through said opening in said photosensitive dielectric material.

13. A method of substantially filling an aperture in a substrate with a quantity of fill material, comprising the steps of:

providing a substrate having first and second opposing surfaces and an aperture passing through said substrate from said first opposing surface to said second opposing surface;

positioning a layer of photosensitive dielectric material adjacent to said first opposing surface of said substrate to cover said aperture;

directing radiant energy through said aperture and onto said layer of photosensitive dielectric material to form an opening in said layer of photosensitive dielectric material adjacent to said aperture; and forcing a quantity of fill material first through said opening in said photosensitive dielectric material and then into said aperture to substantially fill said aperture.

* * * * *